(12) United States Patent
Ryudo et al.

(10) Patent No.: US 11,896,929 B2
(45) Date of Patent: Feb. 13, 2024

(54) LASER DEVICE AND DEHUMIDIFICATION MANAGEMENT METHOD FOR LASER DEVICE

(71) Applicant: Panasonic Intellectual Property Management Co., Ltd., Osaka (JP)

(72) Inventors: Makoto Ryudo, Hyogo (JP); Masatoshi Nishio, Osaka (JP); Jingbo Wang, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 642 days.

(21) Appl. No.: 17/103,021

(22) Filed: Nov. 24, 2020

(65) Prior Publication Data

US 2021/0077946 A1 Mar. 18, 2021

Related U.S. Application Data

(63) Continuation of application No. PCT/JP2019/024824, filed on Jun. 21, 2019.

(30) Foreign Application Priority Data

Jun. 29, 2018 (JP) .................. 2018-124853

(51) Int. Cl.
*B01D 53/04* (2006.01)
*H01S 5/06* (2006.01)
(Continued)

(52) U.S. Cl.
CPC ....... *B01D 53/0454* (2013.01); *B01D 53/261* (2013.01); *H01S 5/068* (2013.01);
(Continued)

(58) Field of Classification Search
CPC .................. H01S 3/303; H01S 5/068
See application file for complete search history.

(56) References Cited

U.S. PATENT DOCUMENTS

2017/0163005 A1 6/2017 Takigawa et al.
2017/0302046 A1 10/2017 Andou

FOREIGN PATENT DOCUMENTS

CN 206532164 U * 9/2017
JP 03-246980 11/1991
(Continued)

OTHER PUBLICATIONS

Office Action "Communication pursuant to Article 94(3) EPC" dated Feb. 3, 2023 in corresponding European Patent Application No. 19826579.5.

(Continued)

*Primary Examiner* — Robert A Hopkins
(74) *Attorney, Agent, or Firm* — Wenderoth, Lind & Ponack, L.L.P.

(57) ABSTRACT

A laser device includes a laser oscillator, a dehumidifier, and a controller controlling an operation of the dehumidifier. The controller controls the dehumidifier such that the dew point inside the laser oscillator is lower than the first dew point when a monolayer or less of water molecules is adsorbed, or such that the dew point is equal to or higher than the second dew point when more than a monolayer of water molecules is adsorbed inside the laser oscillator, and is lower than the third dew point at which the dew condensation starts to occur inside the laser oscillator.

16 Claims, 6 Drawing Sheets

(51) Int. Cl.
   *B01D 53/26*   (2006.01)
   *H01S 5/068*   (2006.01)
   *H01S 5/024*   (2006.01)
(52) U.S. Cl.
   CPC ...... *B01D 2257/80* (2013.01); *B01D 2259/45* (2013.01); *H01S 5/02423* (2013.01)

(56) References Cited

FOREIGN PATENT DOCUMENTS

| | | |
|---|---|---|
| JP | 04-356981 | 12/1992 |
| JP | 06-224495 | 8/1994 |
| JP | H06260708 A * | 9/1994 |
| JP | 2006-013232 | 1/2006 |
| JP | 2012-024778 | 2/2012 |
| JP | 2012-094922 | 5/2012 |
| JP | 2016-015435 | 1/2016 |
| JP | 2017-103414 | 6/2017 |
| JP | 2017-191907 | 10/2017 |

OTHER PUBLICATIONS

Extended European Search Report dated Jul. 28, 2021 in corresponding European Patent Application No. 19826579.5.
International Search Report dated Jul. 23, 2019 in International (PCT) Application No. PCT/JP2019/024824.

* cited by examiner

US 11,896,929 B2

LASER DEVICE AND DEHUMIDIFICATION MANAGEMENT METHOD FOR LASER DEVICE

CROSS-REFERENCE TO RELATED APPLICATIONS

This is a continuation of International Application No. PCT/JP2019/24824 filed on Jun. 21, 2019, which claims priority to Japanese Patent Application No. 2018-124853 filed on Jun. 29, 2018. The entire disclosures of this application is incorporated by reference herein.

BACKGROUND

The present invention relates to a laser device including a dehumidifier, and a dehumidification management method for the laser device.

In conventional large-output laser devices, the temperature is stabilized through water-cooling of a laser source, optical components etc. in the device in order to prevent decrease in performance due to increase in temperature. On the other hand, when the temperature of the laser device is equal to or lower than the predetermined value, there may arise a problem in that dew condensation occurs inside the laser device, and condensed dew water absorbs and disperses a laser beam, which destabilizes laser output.

Japanese Unexamined Patent Publication No. H04-356981 proposes a technique for preventing dew condensation by cooling optical components inside a laser oscillator and blowing dry air onto the surfaces of the optical components.

SUMMARY

In order to prevent dew condensation, the dew point inside the device is typically managed to be equal to or lower than a predetermined management reference value that is lower than the dew condensation point. Japanese Unexamined Patent Publication No. H04-356981 has an object of the conventional configuration to prevent the dew condensation inside the device. However, Japanese Unexamined Patent Publication No. H04-356981 fails to disclose any dew point management.

On the other hand, the present inventors have found through analysis that the laser output may be unstable if the dew point in the laser device, particularly in the laser oscillator, is merely managed to be lower than the dew condensation point.

The present invention has been made in view of the above, and it is an object thereof to provide a laser device and a dehumidification management method for the laser device, which enables reduce of a risk formation of dew condensation inside the laser device as well as fluctuations of laser output.

In order to achieve the above object, the laser device of the present invention includes a laser oscillator; a dehumidifier for dehumidifying inside of the laser oscillator; and a controller controlling an operation of the dehumidifier, wherein the controller controls the dehumidifier such that a dew point inside the laser oscillator is lower than a first dew point at which a monolayer or less of water molecules is adsorbed, or equal to or higher than a second dew point at which more than a monolayer of water molecules is adsorbed inside the laser oscillator and lower than a third dew point at which dew condensation starts to occur inside the laser oscillator. The first dew point is a value corresponding to an upper limit value of water vapor pressure in a state in which a monolayer or less of water molecules is adsorbed inside the laser oscillator. The second dew point is a value corresponding to or higher than a lower limit value of the water vapor pressure in a state in which more than a monolayer of water molecules is adsorbed inside the laser oscillator. The third dew point is a value corresponding to the upper limit value of the water vapor pressure in a state in which more than a monolayer of water molecules is adsorbed inside the laser oscillator and exceeds the second dew point.

This configuration enables to reduce the risk of the dew condensation inside the laser device and reduce output fluctuations of the laser beam, thereby making it possible to stabilize the performance of the laser device.

A dehumidification management method of the present invention is a dehumidification management method for a laser device including a laser oscillator, and a dehumidifier for dehumidifying the inside of the laser oscillator, wherein a dew point inside the laser oscillator is made to be lower than a first dew point at which a monolayer or less of water molecules is adsorbed, or to be equal to or higher than a second dew point at which more than a monolayer of water molecules is adsorbed inside the laser oscillator and lower than a third dew point at which dew condensation starts to occur inside the laser oscillator. The first dew point is a value corresponding to an upper limit value of water vapor pressure in a state in which a monolayer or less of water molecules is adsorbed inside the laser oscillator. The second dew point is a value corresponding to or higher than a lower limit value of the water vapor pressure in a state in which more than a monolayer of water molecules is adsorbed inside the laser oscillator. The third dew point is a value corresponding to the upper limit value of the water vapor pressure in a state in which more than a monolayer of water molecules is adsorbed inside the laser oscillator and exceeds the second dew point.

This method enables to reduce the risk of the dew condensation inside the laser device and reduce output fluctuations of the laser beam, thereby making it possible to stabilize the performance of the laser device.

As described above, according to the dehumidification management method for the laser oscillator and the laser device of the present invention, it is possible to reduce the risk of formation of dew condensation inside the laser device and output fluctuations of laser beam, thereby making it possible to stabilize the performance of the laser device.

DETAILED DESCRIPTION

Hereinafter, embodiments of the present invention will be described in detail with reference to the drawings. The following description of advantageous embodiments is a mere example in nature, and is not at all intended to limit the scope, applications or use of the present invention.

First Embodiment

[Configuration of Laser Device]

Figure 1:
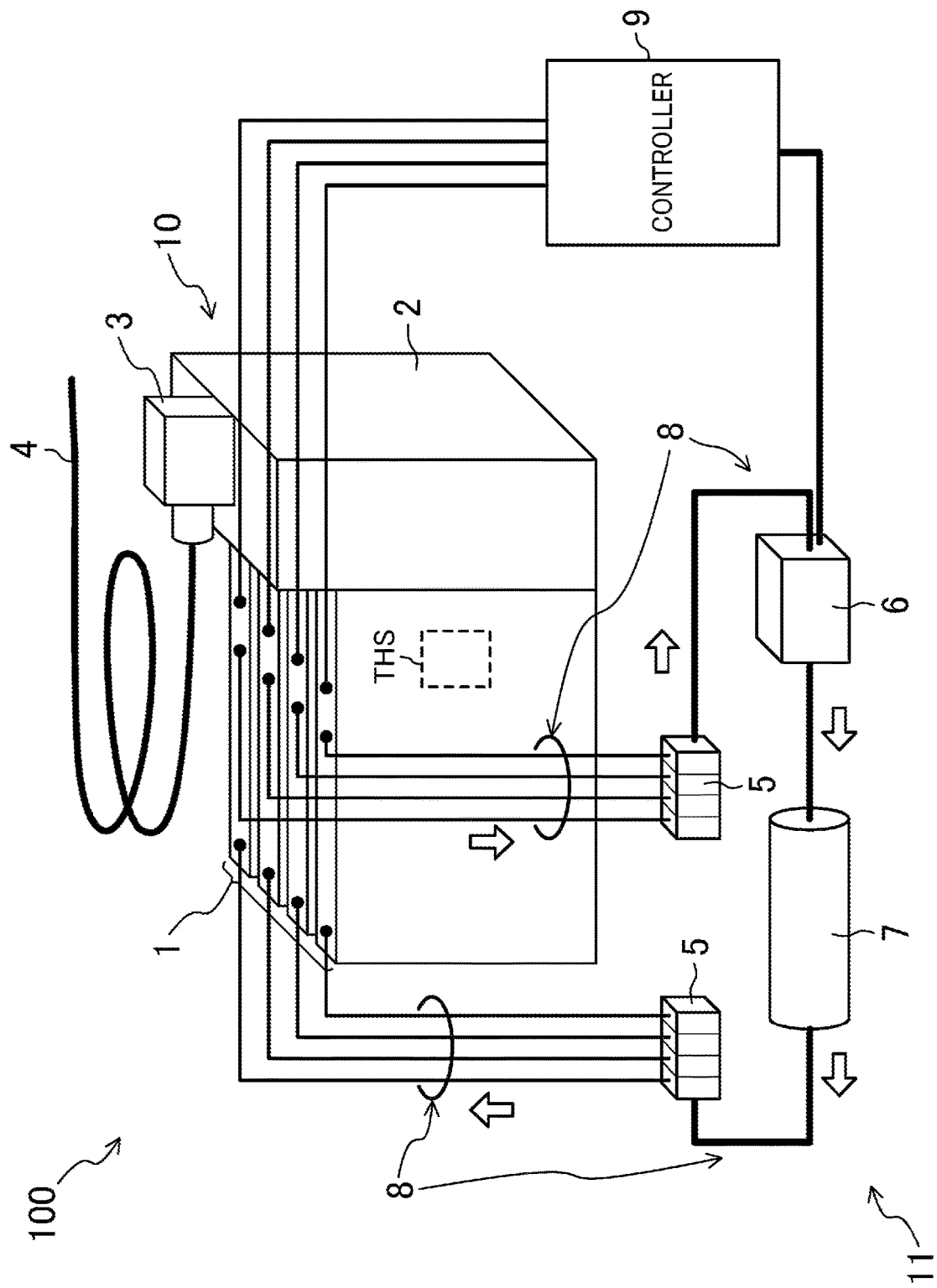
FIG. 1 is a schematic view illustrating a configuration of a laser device of a first embodiment of the present invention.

FIG. 1 is a schematic view illustrating a configuration of a laser device of the present embodiment. The laser device 100 includes a laser oscillator 10, a dehumidifier 11, and a controller 9.

The laser oscillator 10 includes laser modules 1, a beam combiner 2, and a light collection optical unit 3. An optical fiber 4 is connected to the light collection optical unit 3. The optical fiber 4 guides a laser beam LB described later to a laser beam emission portion (not shown).

The laser module 1 includes a plurality of laser diodes or laser arrays emitting laser beams with different wavelengths. The laser beams that have been wavelength-synthesized in the laser modules 1 are emitted from the respective laser modules 1. Further, each of the laser modules 1 includes therein a temperature and humidity sensor THS.

The beam combiner 2 combines laser beams emitted from the plurality of laser modules 1 into one laser beam (hereinafter, referred to as the "laser beam LB"), and emits the laser beam LB to the light collection optical unit 3. Specifically, optical axes of each of the laser beams are brought close to each other or made to agree with each other, and combined to become parallel to each other. The wavelength range of the laser beam LB ranges, for example, from 900 nm to 1 µm.

The light collection optical unit 3 includes therein a condensing lens (not shown) and reduces the beam diameter of the laser beam LB incident at a predetermined magnification by using the condensing lens, making laser beam LB enter the optical fiber 4. Further, the light collection optical unit 3 has a connector (not shown) to which an incident end of the transmission fiber 4 is connected.

The laser modules 1, the beam combiner 2, and the light collection optical unit 3 are in communication with each other. The atmosphere inside them (hereinafter, also referred to as the "inside of the laser oscillator 10") is adjusted to have a dew point within a predetermined range. Dehumidification management of the inside of the laser oscillator 10 will be described later in detail.

Such configuration of the laser oscillator 10 enables to obtain the laser device 100 that is high-output and has a laser beam output exceeding several kW. According to the present embodiment, four laser modules 1 are mounted on the laser oscillator 10. However, the present embodiment is not limited to this configuration. The number of the laser modules 1 mounted may be appropriately changed depending on, for example, output specifications required for the laser device 100 or output specifications of each laser module 1.

Although not illustrated, several to a dozen optical components including a condensing lens in the light collection optical unit 3 are disposed inside the laser oscillator 10.

The dehumidifier 11 includes an air pump 6, a desiccator 7, and a dry air distributor 5. The air pump 6, the desiccator 7, and the dry air distributor 5 are serially connected via pipes 8. Further, a plurality of pipes 8 branching off from the dry air distributor 5 are connected to the respective laser modules 1. The air discharged from the air pump 6 flows into the desiccator 7 through the pipe 8. Disposed inside the desiccator 7 is a desiccant as adsorbent (not shown) to absorb moisture in the air flowing into the desiccator 7. Thus, the air with reduced amount of moisture is discharged from the desiccator 7. Then, the air discharged from the desiccator 7 flows into the laser modules 1 via the dry air distributor 5 and the pipe 8. As described above, the parts of the laser oscillator 10 are in communication with each other. Thus, the air with the reduced amount of moisture flows inside the laser oscillator 10, more specifically, inside each of the laser modules 1, the beam combiner 2, and the light collection optical unit 3 into a suction port of the air pump 6 via the pipe 8 and the dry air distributor 5.

As described above, operating the air pump 6 to circulate the air between the dehumidifier 11 and the inside of the laser oscillator 10 decreases the humidity and the dew point inside the laser oscillator 10 to a certain saturation value. According to the present embodiment, the air discharged from the air pump 6 is the atmospheric air. However, the air may be inert gas such as nitrogen gas.

The controller 9 is connected to the laser oscillator 10 and the dehumidifier 11. Specifically, the controller 9 receives an output signal of the temperature and humidity sensor THS disposed inside the laser oscillator 10, and calculates the dew point of the atmosphere inside the laser oscillator 10. The dew point may be calculated for each of the laser modules 1. Alternatively, an average value, a representative value, or the maximum value may be calculated as the dew point of the atmosphere inside the laser oscillator 10 based on the output signal of each of the four temperature and humidity sensors THS. In addition, the controller 9 controls the operation of the dehumidifier 11. Specifically, the control signal is output to the air pump 6 to control the operation of the air pump 6, for example, to start or end the operation.

The controller 9 may be configured to control the laser oscillation of the laser oscillator 10. Specifically, the laser oscillation control of each laser module 1 may be performed by supplying a control signal such as an output voltage or an ON time to a power supply (not shown) connected to the laser oscillator 10. The laser oscillation control may be performed separately on each of the laser modules 1. For example, the laser oscillation output, the ON time, and the like may be configured to be different for each of the laser modules 1.

[Findings Leadings to Present Invention]

Figure 2:
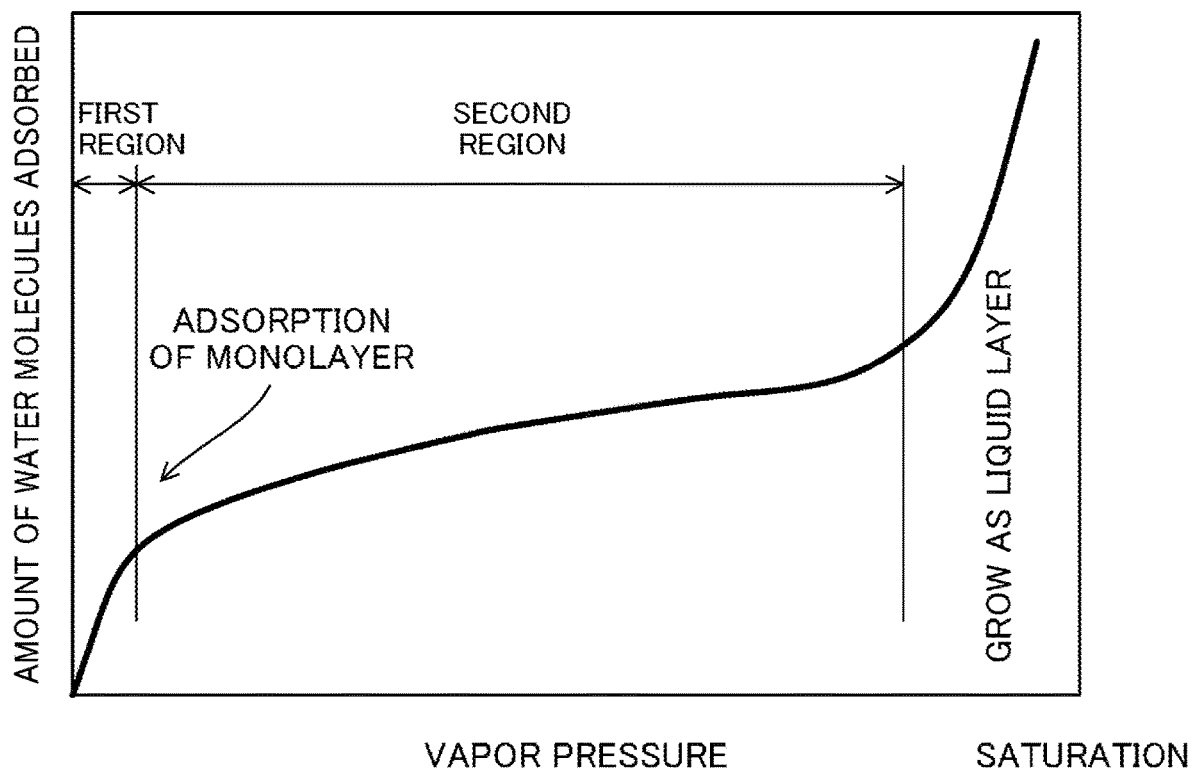
FIG. 2 is a diagram illustrating a moisture adsorption isotherm.
Figure 3:
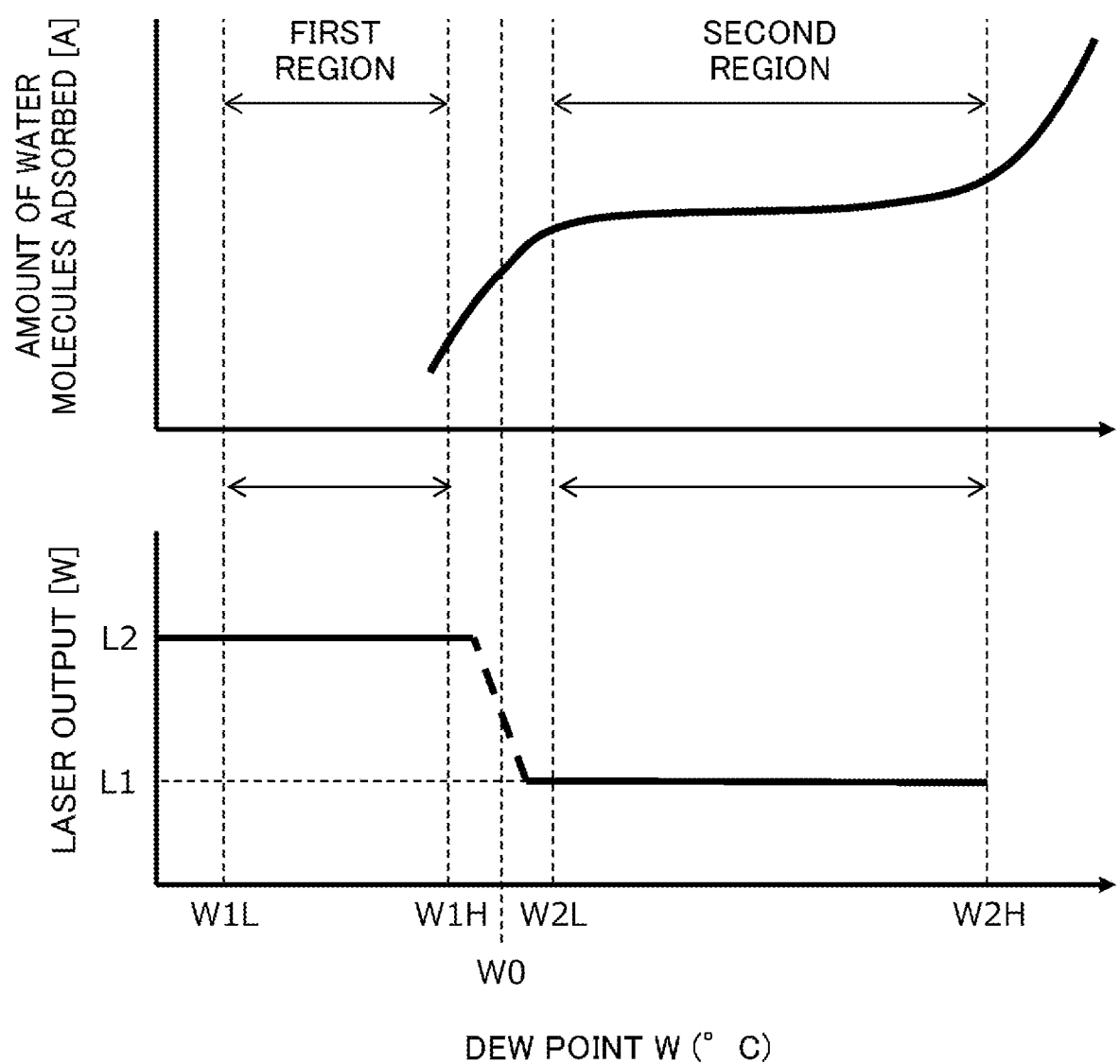
FIG. 3 is a diagram illustrating a relationship between a dew point of an atmosphere inside a laser oscillator and an amount of adsorption of water molecules, and a relationship between the dew point of the atmosphere inside the laser oscillator and laser output.

FIG. 2 illustrates a moisture adsorption isotherm. FIG. 3 illustrates a relationship between the dew point of the atmosphere inside the laser oscillator and an amount of adsorption of water molecules, and a relationship between the dew point of the atmosphere inside the laser oscillator and the laser output.

As shown in FIG. 2, the amount of water molecules adsorbed to the surface of an object increases with the rise of water vapor pressure in the atmosphere in which the object is placed. When the water vapor pressure in the atmosphere starts to increase in a state in which moisture is not adsorbed to the surface of an object, more precisely, moisture is adsorbed in an amount of less than a monolayer, the amount of water molecules adsorbed increases. However, when the water vapor pressure exceeds a certain value, the amount of change of the amount of water molecules adsorbed decreases. Further, when the water vapor pressure starts to increase, the water vapor pressure starts to increase again, reaching a saturated water vapor pressure. That is, the moisture is formed on the surface of an object as a liquid layer. In other words, the dew condensation occurs.

Here, a first region and a second region are distinguished. In the first region, a monolayer or less of water molecules is adsorbed to the surface of an object. In the second region, more than a monolayer of water molecules is adsorbed, but are not formed as a liquid layer, that is, the dew condensation does not occur.

The upper illustration of FIG. 3 illustrates a plot in which the horizontal axis of FIG. 2 is replaced by an axis representing a dew point W. The region between a fourth dew point W1L and a first dew point W1H corresponds to the first region. The region between a second dew point W2L and a third dew point W2H corresponds to the second region. The first dew point W1H corresponds to an upper limit value of the dew point W in the first region, and the second dew point W2L corresponds to a lower limit value of the dew point W in the second region. The first dew point W1H is a value corresponding to the upper limit value of the water vapor pressure in the first region. The second dew point W2L is a value corresponding to the lower limit value of the water vapor pressure in the second region. The third dew point W2H corresponds to an upper limit value of the water vapor pressure in the second region and to a dew point at which the dew condensation starts to occur inside the laser oscillator 10. The fourth dew point W1L is a value corresponding to water vapor pressure lower than the lower limit value of the water vapor pressure in the first region. Hereinafter, the upper limit value of the water vapor pressure in the first region may be referred to as first water vapor pressure, the lower limit value of the water vapor pressure in the second region may be referred to as second water vapor pressure, the upper limit value of the water vapor value in the second region may be referred to as third water vapor pressure, and water vapor pressure lower than the lower limit value of the water vapor pressure in the first region may be referred to as fourth water vapor pressure inside the laser oscillator corresponding to the fourth dew point W1L.

Therefore, when the dew point W is equal to or lower than the first dew point W1H, a monolayer or less of water molecules is adsorbed in the laser oscillator 10. When the dew point W is equal to or higher than the second dew point W2L and lower than the third dew point W2H, more than a monolayer of water molecules is adsorbed in the laser oscillator 10, but the dew condensation does not occur.

However, in reality, the first to third dew points W1H, W2L, and W2H are set values used during dehumidification management of the laser device 100, and do not exactly correspond to the upper limit values, the lower limit value, and the dew condensation point. The first and second dew points W1H and W2L are set with a predetermined margin from the physical upper and lower limit values, in consideration of, for example, variations in the installation positions of the temperature and humidity sensors THS and measurement accuracy. In the present embodiment, the first dew point W1H is set to −12° C., and the second dew point W2L is set to +5° C. However, the first and second dew points are not limited to this embodiment and may be appropriately changed depending on individual differences etc. of the laser oscillator 10.

The fourth dew point W1L is a dew point when the inside of the laser oscillator 10 has been dehumidified to a state that is almost up to the performance limit of the dehumidifier 11, and is set to −30° C. in the present embodiment, but is not limited thereto.

On the other hand, as shown in the lower illustration of FIG. 3, the present inventors have found a phenomenon in which the laser output changes depending on whether the dew point W of the atmosphere inside the laser oscillator 10 (hereinafter, also referred to as the "dew point W inside the laser oscillator 10") is in the first region or the second region. A laser output L1 decreases by about 5% when the dew point W is in the second region with respect to a laser output L2 when the dew point W is in the first region. Such fluctuations in the laser output resulting from changes in the atmosphere of the laser oscillator 10 may cause various malfunctions. For example, when the output decreases by 5% in a case in which the laser oscillator 10 is used as a light source for processing metal or the like, there may arise a problem in faulty processing.

To avoid such decrease in the laser output, the present inventors have considered the following. The light absorption rate of water is usually wavelength-dependent. When the wavelength exceeds 700 nm, the water actually starts to absorb light. However, when the dew point W is in the first region, a monolayer or less of moisture is adsorbed to the surface of an object. Thus, the moisture adsorbed seems to cause no loss in the laser beam LB.

On the other hand, when the dew point W is in the second region, a certain amount of moisture is adsorbed to the surface of an object, even though the dew condensation does not occur. It seems that the laser beam LB is partially absorbed by the adsorbed moisture, which results in decrease in the laser output. As described above, a plurality of optical components, which the laser beam LB enters or passes through, are disposed inside the laser oscillator 10. It seems that a loss in the laser beam LB occurs when the laser beam LB passes through each optical component, which causes decrease by about 5% in total in the output.

Accordingly, when the dew point W inside the laser oscillator 10 is between the first region and the second region, for example, equal to a dew point W0 shown in FIG. 3, the output of the laser beam LB fluctuates due to slight fluctuations of the dew point W, thereby causing a malfunction.

Therefore, the present inventors have focused on the dew point W inside the laser oscillator 10, and proposed a technique to fix the malfunction by controlling the dew point W to be kept within a predetermined range.

When the laser device 100 is actually operated, the dew point W0 may be different for each of the laser oscillators 10. The range of fluctuations of the dew point W is previously measured through experiments. However, the range of fluctuations of the dew point W0 often depends on the capacity, the specifications of internal arrangement etc. of the laser oscillator 10. Thus, the range of fluctuations of the dew point W0 may be compiled in a database of each of the specifications of the laser oscillator 10, and the first dew point W1H and the second dew point W2L may be set based on the database.

[Dehumidification Management Procedure of Laser Device]

Figure 4:
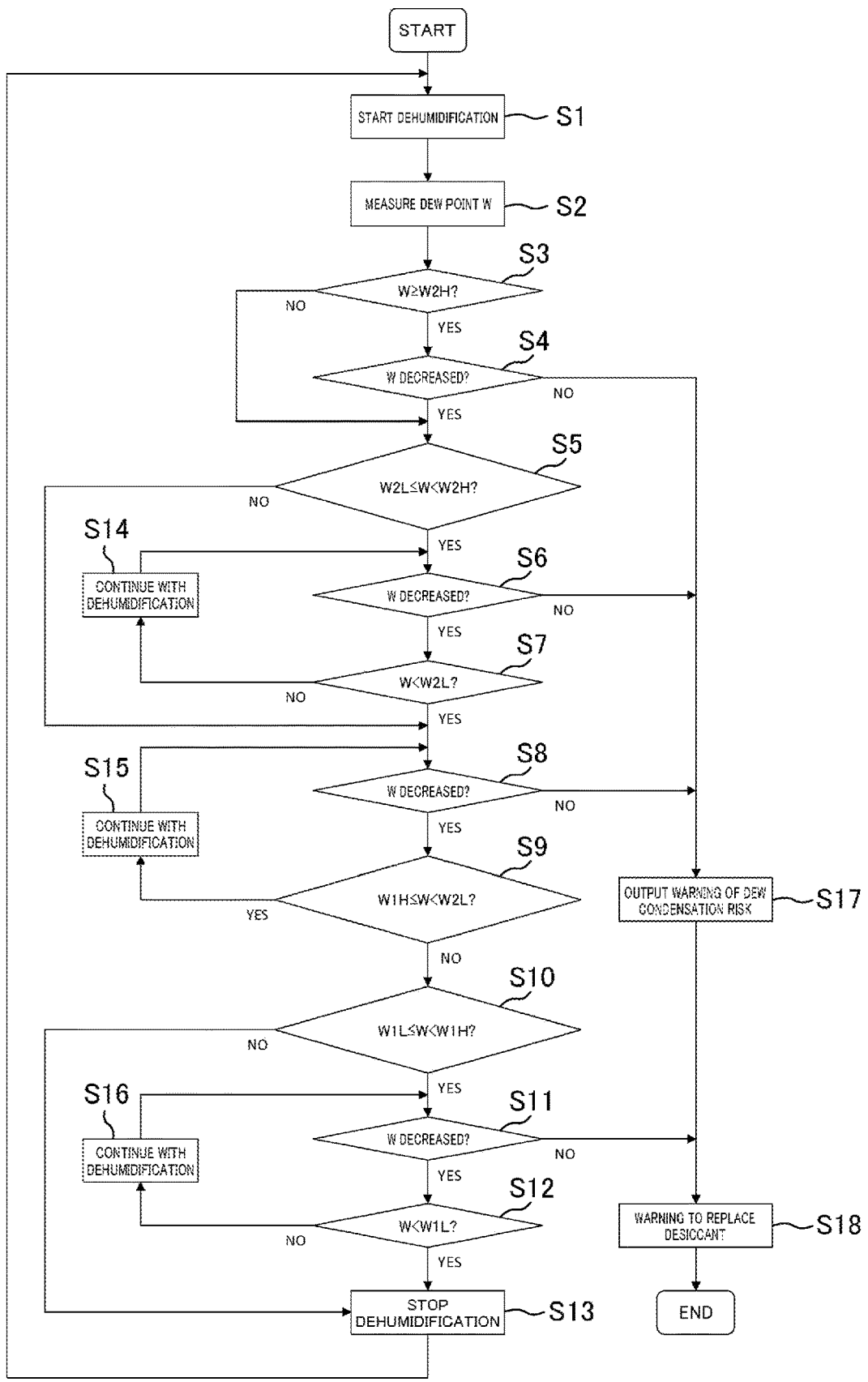
FIG. 4 is a flowchart illustrating a dehumidification management procedure of the laser device of the first embodiment of the present invention.

FIG. 4 illustrates a dehumidification management procedure of the laser device of the present embodiment. In the following procedure, the controller 9 performs various determinations based on an input value and the like.

First, the dehumidifier 11 is operated to start the dehumidification of the inside of the laser oscillator 10 (step S1). Then, the dew point W is measured (step S2). As described above, the dew point W is calculated through a calculation processing performed in the controller 9 based on the output signals of the temperature and humidity sensors THS. The dew point W is measured at every predetermined timing.

It is determined whether the measured dew point W is equal to or larger than the third dew point W2H (step S3). This determination and determinations in the following steps are performed by the controller 9. If the determination result in step S3 is positive, it is determined whether the dew point W has decreased after a lapse of a predetermined time (step S4). If the determination result in step S3 is negative, the procedure proceeds to step S5.

If the determination result in step S4 is positive, it is possible to determine that the dehumidifier 11 is operated normally, and the procedure proceeds to step S5. On the other hand, if the determination result in step S4 is negative, it is possible to determine that the dehumidifier 11 is not operated normally or the dehumidifying capacity of the dehumidifier 11 has decreased beyond the allowable range. Therefore, the controller 9 detects a risk of the dew condensation occurring inside the laser oscillator 10 and outputs a warning signal (step S17). Further, when a predetermined period elapses since output of the warning signal, the controller 9 outputs a separate warning signal to replace the desiccant in the desiccator 7 (step S18).

If the determination result in step S4 is negative, the procedure proceeds to step S5 and it is determined whether the dew point W measured is equal to or higher than the second dew point W2L and lower than the third dew point W2H.

If the determination result in step S5 is positive, it is determined whether the dew point W has decreased after a lapse of a predetermined time (step S6). If the determination result in step S6 is positive, the procedure proceeds to step S7. On the other hand, if the determination result in step S6 is negative, the controller 9 outputs a warning signal informing about the risk of the dew condensation (step S17). Further, when a predetermined period elapses after the warning signal was output, the controller 9 outputs a warning signal urging to replace the desiccant (step S18). If the determination result in step S5 is negative, the procedure proceeds to step S8.

In step S7, it is determined whether the measured dew point W is lower than the second dew point W2L. If the determination result in step S7 is positive, the procedure proceeds to step S8. On the other hand, if the determination result in step S7 is negative, that is, if the dew point W is equal to or higher than the second dew point W2L, it is assumed that the dew point W inside the laser oscillator 10 has increased for a certain reason. Therefore, the procedure proceeds to step S14 to continue dehumidification and returns to step S6 where it is determined whether the dew point W has decreased after a lapse of a predetermined time.

In step S8, it is again determined whether the dew point W has decreased after a lapse of a predetermined time. If the determination result in step S8 is negative, the procedure proceeds to step S17, and, after a lapse of a predetermined time, to step S18.

On the other hand, if the determination result in step S8 is positive, the procedure proceeds to step S9 where it is determined whether the measured dew point W is equal to or higher than the first dew point W1H and lower than the second dew point W2L. If the determination result in step S9 is negative, the procedure proceeds to step S10. Further, if the determination result in step S9 is positive, the dew point W inside the laser oscillator 10 is between the first region and the second region, and the laser output is unstable. Therefore, the procedure proceeds to step S15 to continue the dehumidification and returns to step S8 where it is determined whether the dew point W has decreased after a lapse of a predetermined time.

In step S10, it is determined whether the measured dew point W is equal to or higher than the fourth dew point W1L and lower than the first dew point W1H. If the determination result in step S10 is positive, the procedure proceeds to step S11. On the other hand, if the determination result in step S10 is negative, and the dew point W inside the laser oscillator 10 is lower than the fourth dew point W1L, that is, it is recognized that the inside of the laser oscillator 10 has been dehumidified to a state close to the performance limit of the dehumidifier 11, the dehumidification is stopped (step S13). When a predetermined period elapses after the stop of dehumidification, the dehumidification management returns to step S1 where the dehumidification is restarted.

In step S11, it is again determined whether the dew point W has decreased after a lapse of a predetermined time. If the determination result in step S11 is negative, the procedure proceeds to step S18 where the controller 9 outputs a warning signal prompting to replace the desiccant.

If the determination result in step S11 is positive, it is determined whether the dew point W is lower than the fourth dew point W1L (step S12). If the determination result in step S12 is positive, the procedure proceeds to step S13 to stop the dehumidification, and, after a lapse of a predetermined time, returns to step S1 where the dehumidification is restarted. If the determination result in step S12 is negative, the procedure proceeds to step S16 to continue the dehumidification and returns to step S11 where it is determined whether the dew point W has decreased after a lapse of a predetermined time.

In the steps S17 and S18, a notification, based on the warning signal from the controller 9, informing about the risk of dew condensation occurring inside the laser oscillator 10 and about an upcoming period of desiccant replacement is sent to an operator of the laser device 100. In practice, the operator is notified about the upcoming replacement period by a warning screen displayed on a display (not shown), or by a warning sound or a warning audio output from an audio output unit (not shown).

If the dew point W inside the laser oscillator 10 reaches +15° C. or more, the controller 9 also outputs the warning signal for urging to replace the desiccant in the desiccator 7. Considering, for example, variations in the installation positions of the temperature and humidity sensors THS and the measurement accuracy thereof, the actual value of the third dew point W2H is set to be lower than the above value (+15° C.) of the third dew point W2H, for example, +13° C. Consequently, in a case in which the third dew point W2H is set to a value lower than its actual value in consideration of, for example, variations in the installation positions of the temperature and humidity sensors THS and the measurement accuracy, the dew condensation does not occur inside the laser oscillator 10. In response to the cooling temperature and the like of the laser oscillator 10 (not shown), the lower limit value of the dew point and the set value of the third dew point W2H, at which the warning signal is output, are appropriately changed.

According to the dehumidification management procedure, if the dew point W inside the laser oscillator 10 has sufficiently decreased to the first region due to operation of the dehumidifier 11, the controller 9 notifies the operator that the dew point W is in the first region. Then, the operator confirms the laser output is in the first region. Alternatively, the operator corrects the laser output, if necessary. Further, the laser oscillation is performed by controlling the dew point W in the first region in which the laser output is higher than in the second region. In addition, when the dehumidifying capacity of the desiccant in the desiccator 7 of the dehumidifier 11 decreases, and the dew point W cannot be lowered to the first region. However, if it is sufficiently possible to maintain the dew point W in the second region, the controller 9 notifies the operator that the dew point W is the second region. Then, the operator confirms that the laser output is in the second region. Alternatively, the operator corrects the laser output, if necessary. Further, the laser oscillation is performed by controlling the dew point W in the second region in which the laser output is smaller than in the first region.

In other words, the laser oscillator 10 is configured to be capable of emitting the laser beam LB to the outside when the dew point inside the laser oscillator 10 is lower than the first dew point W1H, or when the dew point in the laser oscillator 10 is equal to or higher than the second dew point W2L and lower than the third dew point W2H.

[Advantages]

As described above, the laser device 100 of the present embodiment includes the laser oscillator 10, the dehumidifier 11 for dehumidifying the inside of the laser oscillator 10, and the controller 9 controlling the operation of the dehumidifier 11.

The controller 9 controls the dehumidifier 11 such that a dew point W inside the laser oscillator 10 is lower than a first dew point W1H at which a monolayer or less of water molecules is adsorbed, or equal to or higher than a second dew point W2L at which more than a monolayer of water molecules is adsorbed inside the laser oscillator 10 and lower than a third dew point W2H at which dew condensation starts to occur inside the laser oscillator 10.

Further, the method of dehumidification management of the laser device 100 of the present embodiment includes managing the dew point W inside the laser oscillator 10 to be lower than the first dew point W1H at which a monolayer or less of water molecules is adsorbed inside the laser oscillator 10, or to be equal to or higher than the second dew point W2L at which more than a monolayer of water molecules is adsorbed inside the laser oscillator 10 and lower than the third dew point W2H at which the dew condensation starts to occur inside the laser oscillator 10.

In this way, it is possible to prevent the risk of the dew condensation that may cause malfunction of the laser oscillator 10 and to reduce output fluctuations of the laser beam LB resulting from adsorbing moisture, and the performance of the laser device 100 may be stabilized.

The dehumidifier 11 includes the desiccator 7 including a desiccant as an adsorbent, and the air pump 6 connected to the desiccator 7. The dehumidifier 11 dehumidifies the inside of the laser oscillator 10 by circulating air between the inside of the laser oscillator 10 and the air pump 6 via the pipe 8 connecting the desiccator 7, the air pump 6, and the laser oscillator 10, and via the desiccator 7.

In this way, the inside of the laser oscillator 10 may be dehumidified with a simple configuration.

If the dew point W does not decrease after a lapse of a predetermined time when the dehumidifier 11 is operated, the controller 9 warns the operator.

In this way, the operator may be reliably notified about the risk of the dew condensation inside the laser oscillator 10 and the upcoming period of desiccant replacement in the desiccator 7.

Further, the dew point W may be calculated in the controller 9 based on the output signals of the temperature and humidity sensors THS disposed inside the laser oscillator 10.

Further, in the laser device 100, the laser oscillator 10 is configured to be able to emit the laser beam LB to the outside when the dew point inside the laser oscillator 10 is lower than the first dew point W1H or when the dew point inside the laser oscillator 10 is equal to or higher than the second dew point W2L and lower than the third dew point W2H.

In this way, the output of the laser beam LB may be stabilized for an extended period, and the reliability of the laser device 100 may be improved.

The method of the dehumidification management of the laser device 100 includes a step of dehumidifying of the inside of the laser oscillator 10 by operating the dehumidifier 11, a step of measuring a dew point W inside the laser oscillator 10, a step of continuing with dehumidification of the inside of the laser oscillator 10 if it is determined whether or not the dew point W is equal to or higher than the first dew point W1H and lower than the second dew point W2L and a determination result is positive, and a step of stopping the operation of the dehumidifier 11 if the dew point W is lower than the fourth dew point W1L which is lower than the first dew point W1H.

In this way, the laser device 100 may be operated while the dew point W falls out of the range in which the output of the laser beam LB fluctuates, and the performance of the laser device 100 may be stabilized. In addition, at the time at which the dew point W inside the laser oscillator 10 does not need to decrease any more, the operation of the dehumidifier 11 is stopped, thereby reducing the operation costs and reducing the numbers of replacement cycles of the desiccant to reduce the risk of dropped productivity.

Second Embodiment

Figure 5:
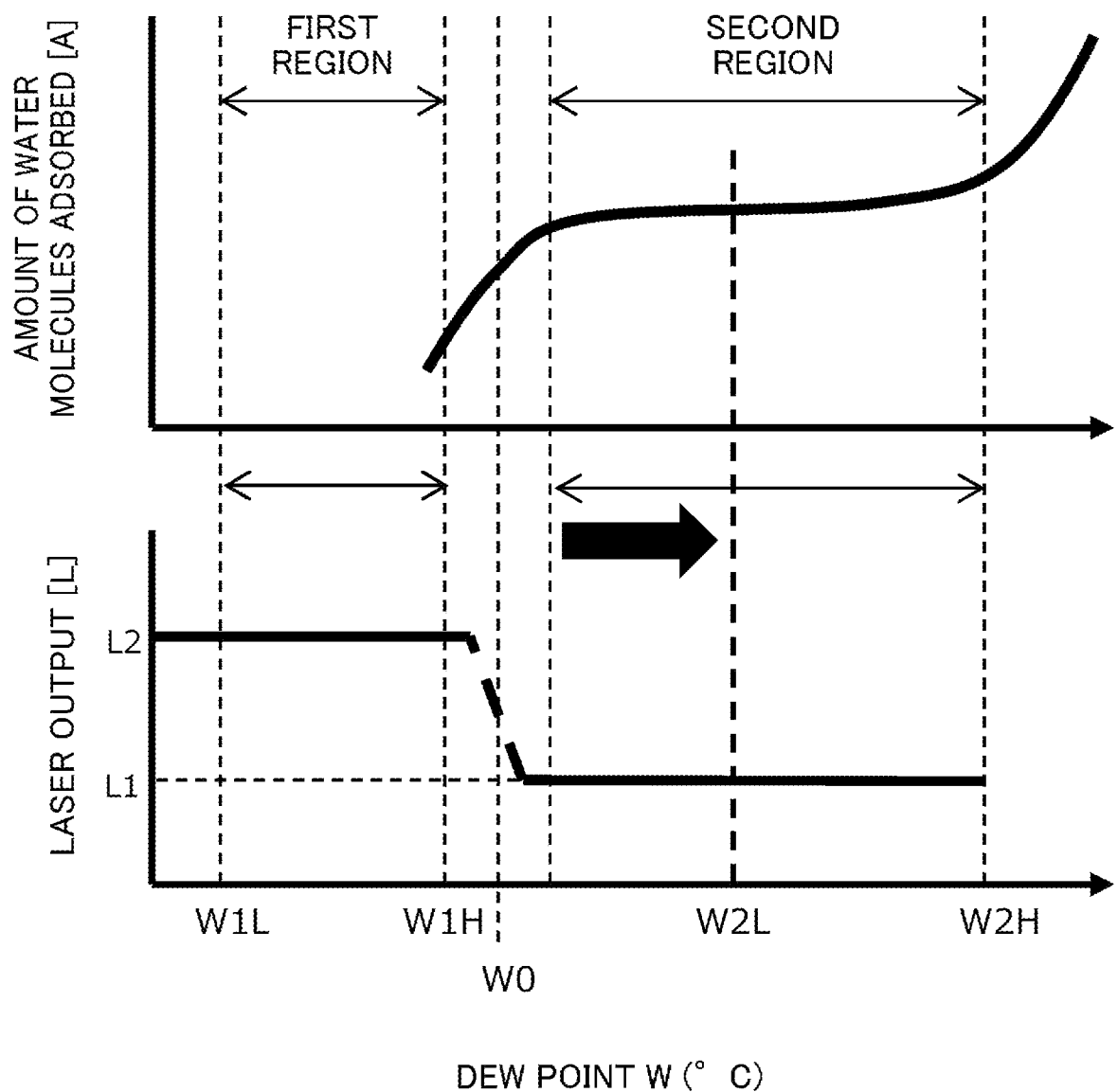
FIG. 5 is a diagram illustrating a relationship between a dew point of an atmosphere inside a laser oscillator of a second embodiment of the present invention and an amount of adsorption of water molecules, and a relationship between the dew point of the atmosphere inside the laser oscillator and laser output of the second embodiment of the present invention.
Figure 6:
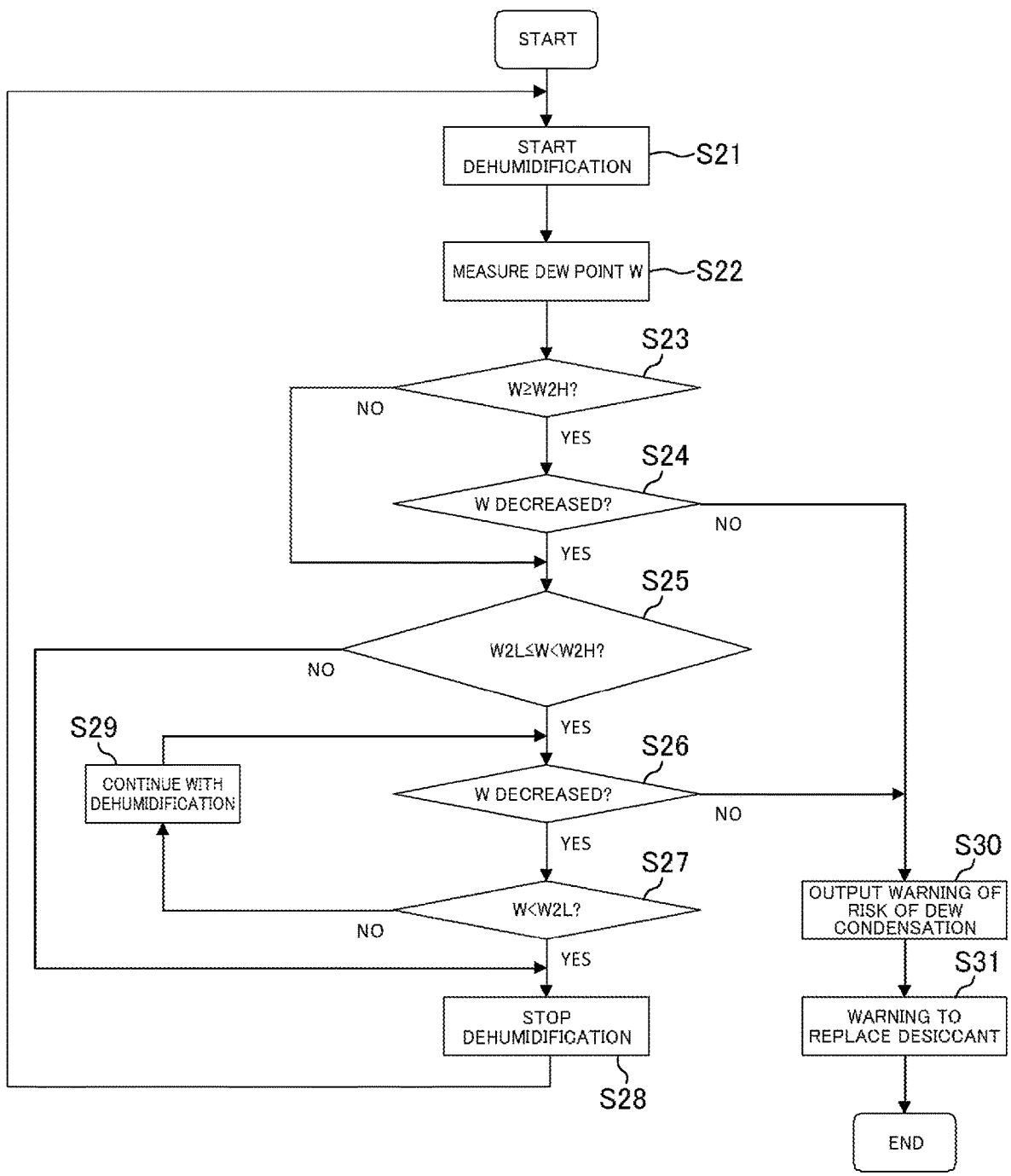
FIG. 6 is a flowchart illustrating a dehumidification management procedure of the laser device of the second embodiment of the present invention.

FIG. 5 illustrates a relationship between a dew point of an atmosphere inside a laser oscillator and an amount of adsorption of water molecules, and a relationship between the dew point of the atmosphere inside the laser oscillator and laser output. according to the present embodiment. FIG. 6 illustrates a dehumidification management procedure of the laser device.

As described above, moisture adsorbed inside the laser oscillator 10 absorbs the laser beam LB and thus leads to a decrease in the laser output.

On the other hand, water molecules that adhere to the surface of an object serve to reduce the static electricity generated on the surface they adhere to. Therefore, when the dew point W inside the laser oscillator 10 is in a first region shown in FIG. 3, where a monolayer or less of water molecules is adsorbed to the surfaces of the optical components, the static electricity is easily generated on the surface, and thus tiny dust and the like is easily adsorbed.

However, when the laser device 100 is a large-output laser device for processing metal or the like, even slight dust or dirt on the optical components disposed inside the laser oscillator 10 may cause a serious failure of the laser device 100 and the laser oscillator 10 since dust or dirt absorbs the laser beam LB and burn, resulting in damages to the optical components. The laser oscillator 100 is normally assembled in a cleanroom where cleanliness is controlled. However, when the cleanliness of the cleanroom is low, it is difficult to sufficiently eliminate tiny dust and the like. That is, if the cleanliness at the time of assembling the laser oscillator 100 is insufficient, a failure may occur in the laser device 100 and the laser oscillator 10 when the dew point W inside the laser oscillator 10 is in the first region.

Here, as shown in FIG. 5, setting the set value of the second dew point W2L to a value higher than the lower limit value of the dew point W in the second region, and managing the dew point W inside the laser oscillator 10 to be equal to or higher than the second dew point W2L and lower than the third dew point W2H enables to reduce the risk of occurrence of dew condensation and generation of the static electricity inside the laser oscillator 10, while reducing output fluctuations of the laser beam LB, making it possible to stabilize the performance of the laser device 100. In other words, the set value of the second dew point W2L is set to be higher than the value corresponding to the lower limit of the water vapor pressure in the second region. In addition, the dew point W inside the laser oscillator 10 is controlled to be greater than the second dew point W2L and lower than the third dew point W2H. Accordingly, the risk of generation of dew condensation or static electricity inside the laser oscillator 10 can be reduced while reducing fluctuations in output of the laser beam LB, thereby making it possible to stabilize the performance of the laser device 100. Note that water vapor pressure corresponding to the set value of the second dew point W2L of the present embodiment may also be referred to as the second water vapor pressure.

As shown in FIG. 6, the dehumidification management procedure in this case is simplified as compared to the procedure shown in FIG. 4. Since steps S21 to S27 shown in FIG. 6 are the same as steps S1 to S7 shown in FIG. 4, the description thereof will be omitted. Further, since steps S28 and S29 in FIG. 6 are the same as steps S13 and S14 in FIG. 4, and steps S30 and S31 in FIG. 6 are the same as the steps S17 and S18 in FIG. 4, the description thereof will be omitted.

The timing of stopping dehumidification varies in the dehumidification management procedure of the present embodiment and the dehumidification management procedure of the first embodiment. In the present embodiment, the dehumidification is stopped (step S28) when the dew point W inside the laser oscillator 10 becomes lower than the second dew point W2L.

That is, when the dew point W becomes lower than the second dew point W2L, there is a possibility that the dew point W reaches the dew point W0 that is in a range where the dew point W is equal to or higher than the first dew point W1H and lower than the second dew point W2L (the range between the first region and the second region), which is the dew point at which the output fluctuations of the laser beam LB are likely to occur, as in the range of laser output fluctuations shown in, for example FIG. 5. For this reason, the controller 9 determines that continuing the operation of the dehumidifier 11 is unnecessary, and stops the dehumidification by the dehumidifier 11 (step S28). After a lapse of a predetermined time, the procedure returns to step S21 where the dehumidification of the inside of the laser oscillator 10 is restarted.

According to the present embodiment, when the dew point W becomes lower than the second dew point W2L, the operation of the dehumidifier 11 is stopped. Thus, it is possible to maintain a state in which a predetermined amount of moisture is adsorbed inside the laser oscillator 10, in particular, to the surfaces of the optical components (not shown), and the risk of generation of static electricity may be reduced. Accordingly, the risk of adsorption of dust and the like to the optical components may be reduced, and the risk of damage caused to the optical components due to absorption of the laser beam LB through the dust or the like may be reduced.

Further, the controller 9 controls the dehumidifier 11 such that the dew point W inside the laser oscillator 10 is equal to or higher than the second dew point W2L and lower than the third dew point W2H, thereby making it possible to stabilize the performance of the laser device 100. Further, since the second dew point W2L is set to a value higher than the lower limit value of the second region in which more than a monolayer of moisture is adsorbed to the surface, it is possible to reliably maintain a predetermined amount of moisture adsorbed to the surfaces of the optical components, and to reduce the risk of generation of static electricity.

It should be noted that the output of the laser beam LB in the present embodiment decreases by about 5% with respect to the output of the laser beam LB in the first embodiment, but the output fluctuations of the laser beam LB may be reduced.

Other Embodiments

In the first and second embodiments, the temperature and humidity sensors THS are disposed inside the laser modules 1. However, the respective temperature and humidity sensors THS may be disposed in, for example, the beam combiner 2, the light collection optical unit 3, and the like.

The laser sources in the laser oscillator 10 are not necessarily the laser modules 1, and a single laser source may be used. Further, the adsorbent in desiccator 7 may be a zeolitic material or any other type of material.

The laser device of the present invention makes it possible to reduce the risk of dew condensation inside thereof and to reduce fluctuations of the laser output, and is therefore useful when applied to a large-output laser device used for processing metal and the like.

DESCRIPTION OF REFERENCE CHARACTERS

1 Laser Module
2 Beam Combiner
3 Light Condensing Optical Unit
4 Optical Fiber
5 Dry Air Distributor
6 Air Pump
7 Desiccator
8 Pipe
9 Controller
10 Laser Oscillator
11 Dehumidifier
100 Laser Device
THS Temperature and Humidity Sensor
W1H First Dew Point
W2L Second Dew Point
W2H Third Dew Point
W1L Fourth Dew Point

The invention claimed is:
1. A laser device comprising:
a laser oscillator;
a dehumidifier for dehumidifying inside of the laser oscillator; and
a controller controlling an operation of the dehumidifier, wherein the controller is configured to control the dehumidifier such that a dew point inside the laser oscillator meets a condition one and a condition two, wherein the condition one is when the dew point inside the laser oscillator is lower than a first dew point at which a monolayer or less of water molecules is adsorbed, and wherein the condition two is when the dew point inside the laser oscillator is equal to or higher than a second dew point at which more than a monolayer of water molecules is adsorbed inside the laser oscillator and lower than a third dew point at which dew condensation starts to occur inside the laser oscillator, wherein the first dew point is a value corresponding to an upper limit value of water vapor pressure in a state in which a monolayer or less of water molecules is adsorbed inside the laser oscillator, wherein the second dew point is a value corresponding to or higher than a lower limit value of water vapor pressure in a state in which more than a monolayer of water molecules is adsorbed inside the laser oscillator, and wherein the third dew point is a value corresponding to an upper limit value of water vapor pressure in a state in which more than a monolayer of water molecules is adsorbed inside the laser oscillator and being higher than the second dew point.

2. The laser device of claim 1, wherein
the dehumidifier includes a desiccator including an adsorbent, and an air pump connected to the desiccator; and
the dehumidifier dehumidifies the inside of the laser oscillator by circulating air between the inside of the laser oscillator and the air pump via the desiccator and a pipe that connects the desiccator, the air pump, and the laser oscillator.

3. The laser device of claim 1, wherein
the controller warns an operator if the dehumidifier is operated and the dew point does not decrease after a lapse of a predetermined time.

4. The laser device of claim 1, wherein
the laser oscillator is configured to be capable of emitting a laser beam to outside when a dew point inside the laser oscillator is lower than the first dew point, or the dew point inside the laser oscillator is equal to or higher than the second dew point and lower than the third dew point.

5. A dehumidification management method for a laser device including a laser oscillator, a dehumidifier for dehumidifying the inside of the laser oscillator, and a controller,
wherein the controller is configured to control the dehumidifier such that a dew point inside the laser oscillator meets a condition one and a condition two, wherein the condition one is when the dew point inside the laser oscillator is lower than a first dew point at which a monolayer or less of water molecules is adsorbed, and wherein the condition two is when the dew point inside the laser oscillator is equal to or higher than a second dew point at which more than a monolayer of water molecules is adsorbed inside the laser oscillator and lower than a third dew point at which dew condensation starts to occur inside the laser oscillator, wherein the first dew point is a value corresponding to an upper limit value of water vapor pressure in a state in which a monolayer or less of water molecules is adsorbed inside the laser oscillator, wherein the second dew point is a value corresponding to or higher than a lower limit value of water vapor pressure in a state in which more than a monolayer of water molecules is adsorbed inside the laser oscillator, and wherein the third dew point is a value corresponding to an upper limit value of water vapor pressure in a state in which more than a monolayer of water molecules is adsorbed inside the laser oscillator and being higher than the second dew point.

6. The method of claim 5, further comprising:
dehumidifying the inside of the laser oscillator by operating the dehumidifier;
measuring the dew point inside the laser oscillator;
continuing with dehumidification of the inside of the laser oscillator if, after determining whether the dew point is equal to or higher than the first dew point and equal to or lower than the second dew point, a determination result is positive; and
stopping an operation of the dehumidifier if the dew point is lower than a fourth dew point that is lower than the first dew point.

7. The method of claim 5, further comprising:
dehumidifying the inside of the laser oscillator by operating the dehumidifier;
measuring the dew point inside the laser oscillator;
continuing with dehumidification of the inside of the laser oscillator if, after determining whether the dew point is equal to or higher than the second dew point and lower than the third dew point, a determination result is positive; and
stopping the operation of the dehumidifier if the dew point is lower than the second dew point.

8. The method of claim 5, wherein
a warning is sent to an operator if the dehumidifier is operated and the dew point does not decrease after a lapse of a predetermined time.

9. A laser device comprising:
a laser oscillator;
a dehumidifier for dehumidifying inside of the laser oscillator; and
a controller controlling an operation of the dehumidifier,
wherein the controller is configured to control the dehumidifier such that water vapor pressure inside the laser oscillator meets a condition one and a condition two, wherein the condition one is when water vapor pressure inside the laser oscillator is lower than a first water vapor pressure at which a monolayer or less of water molecules is adsorbed, and wherein the condition two is when water vapor pressure inside the laser oscillator is equal to or higher than a second water vapor pressure at which more than a monolayer of water molecules is adsorbed inside the laser oscillator and lower than a third water vapor pressure at which dew condensation starts to occur inside the laser oscillator.

10. The laser device of claim 9, wherein
the dehumidifier includes a desiccator including an adsorbent, and an air pump connected to the desiccator; and
the dehumidifier dehumidifies the inside of the laser oscillator by circulating air between the inside of the laser oscillator and the air pump via the desiccator and a pipe that connects the desiccator, the air pump, and the laser oscillator.

11. The laser device of claim 9, wherein
the controller warns an operator if the dehumidifier is operated and the water vapor pressure does not decrease after a lapse of a predetermined time.

12. The laser device of claim 9, wherein
the laser oscillator is configured to be capable of emitting a laser beam to outside when water vapor pressure inside the laser oscillator is lower than the first water vapor pressure, or the water vapor pressure inside the laser oscillator is equal to or higher than the second water vapor pressure and lower than the third water vapor pressure.

13. A dehumidification management method for a laser device including a laser oscillator, a dehumidifier for dehumidifying the inside of the laser oscillator, and a controller,
wherein the controller is configured to control the dehumidifier such that such that a water vapor pressure inside the laser oscillator meets a condition one and a condition two,
wherein the condition one is when water vapor pressure inside the laser oscillator is lower than a first water vapor pressure at which a monolayer or less of water molecules is adsorbed, and
wherein the condition two is when water vapor pressure inside the laser oscillator is equal to or higher than a second water vapor pressure at which more than a monolayer of water molecules is adsorbed inside the laser oscillator and lower than a third water vapor pressure at which dew condensation starts to occur inside the laser oscillator.

14. The method of claim 13, further comprising:
dehumidifying the inside of the laser oscillator by operating the dehumidifier;
measuring atmosphere inside the laser oscillator by a humidity sensor;
continuing with dehumidification of the inside of the laser oscillator if, after determining whether the water vapor pressure is equal to or higher than the first water vapor pressure and equal to or lower than the second water vapor pressure, a determination result is positive; and
stopping an operation of the dehumidifier if the water vapor pressure is lower than a fourth water vapor pressure that is lower than the first water vapor pressure.

15. The method of claim 13, further comprising:
dehumidifying the inside of the laser oscillator by operating the dehumidifier;
measuring the atmosphere inside the laser oscillator by the humidity sensor;
continuing with dehumidification of the inside of the laser oscillator if, after determining whether the water vapor pressure is equal to or higher than the second water vapor pressure and lower than the third water vapor pressure, a determination result is positive; and
stopping the operation of the dehumidifier if the water vapor pressure is lower than the second water vapor pressure.

16. The method of claim 13, wherein
a warning is sent to an operator if the dehumidifier is operated and the water vapor pressure does not decrease after a lapse of a predetermined time.

* * * * *